United States Patent
Chen et al.

(10) Patent No.: US 8,225,175 B2
(45) Date of Patent: Jul. 17, 2012

(54) TWO-PLANE ERROR CORRECTION METHOD FOR A MEMORY DEVICE AND THE MEMORY DEVICE THEREOF

(75) Inventors: Tsung-Heng Chen, Taipei County (TW); Tsang-Yi Chen, Taipei County (TW); Chih-Heng Chiu, Taipei (TW); Chung-Won Shu, Taipei (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 328 days.

(21) Appl. No.: 12/770,767

(22) Filed: Apr. 30, 2010

(65) Prior Publication Data

US 2011/0191651 A1  Aug. 4, 2011

(30) Foreign Application Priority Data

Feb. 4, 2010  (TW) ............................. 99103310 A (51) Int. Cl.
*H03M 13/00* (2006.01)
*G06F 11/00* (2006.01)

(52) U.S. Cl. ........................................ 714/758; 714/802
(58) Field of Classification Search ................. None
See application file for complete search history.

(56) References Cited

U.S. PATENT DOCUMENTS

| | | | | |
|---|---|---|---|---|
| 5,056,095 A | * | 10/1991 | Horiguchi et al. | 714/765 |
| 7,669,097 B1 | * | 2/2010 | Teig et al. | 714/725 |
| 2002/0166090 A1 | * | 11/2002 | Maeda et al. | 714/746 |

* cited by examiner

*Primary Examiner* — Guerrier Merant
(74) *Attorney, Agent, or Firm* — Winston Hsu; Scott Margo (57) ABSTRACT

In order to correct errors of a first page on one plane in a two-plane NAND flash memory, use data of a second page on another plane to mix the encoding and leverage the error correction code of the first page. Each of the error correction codes of the first page and the second page is divided into an inner correction code and a cross correction code. The inner correction codes are used to correct errors of their own pages and the cross correction codes are used to correct errors of two distinct groups, grouped from the even and odd bytes of the two pages respectively. The second page, with fewer errors, is therefore used to enhance the correcting ability of the first page, without lengthening the error correction code of the first page.

10 Claims, 10 Drawing Sheets

TWO-PLANE ERROR CORRECTION METHOD FOR A MEMORY DEVICE AND THE MEMORY DEVICE THEREOF

BACKGROUND OF THE INVENTION

1. Field of the Invention

The invention relates to an error correction method and a memory device thereof, and more particularly, to a method that uses two-plane structure of the memory device for mixing the encoding/decoding to enhance the correcting ability and reliability and the memory device using such method.

2. Description of the Prior Art

Flash memories nowadays commonly use two-plane read/write technology to concurrently access different blocks so as to enhance the read/write efficiency. Due to the physical limitation of the times of read/write of a flash memory, each block therefore has different worn-out rate, adding the fact that the floating gates, which are mainly used as recording unit for NAND type flash memory, may go through program disturb when writing data, read disturb caused by too many access times, and influences by the defects, environment, and temperature, quite a few generic floating gate faults exist in every flash memory. In a common situation, a single level cell (SLC) memory has generic fault rate falling within $10^{-9} \sim 10^{-11}$ and a multi level cell (MLC) memory has generic fault rate falling within $10^{-5} \sim 10^{-7}$.

To deal with the data error caused by the floating gate fault, error correction code (ECC) is extensively used to lower the fault rate. For example, the ECC having 7 bits correctability may substantially improve the fault rate of a MLC flash memory to within $10^{-20} \sim 10^{-35}$.

Figure 1:
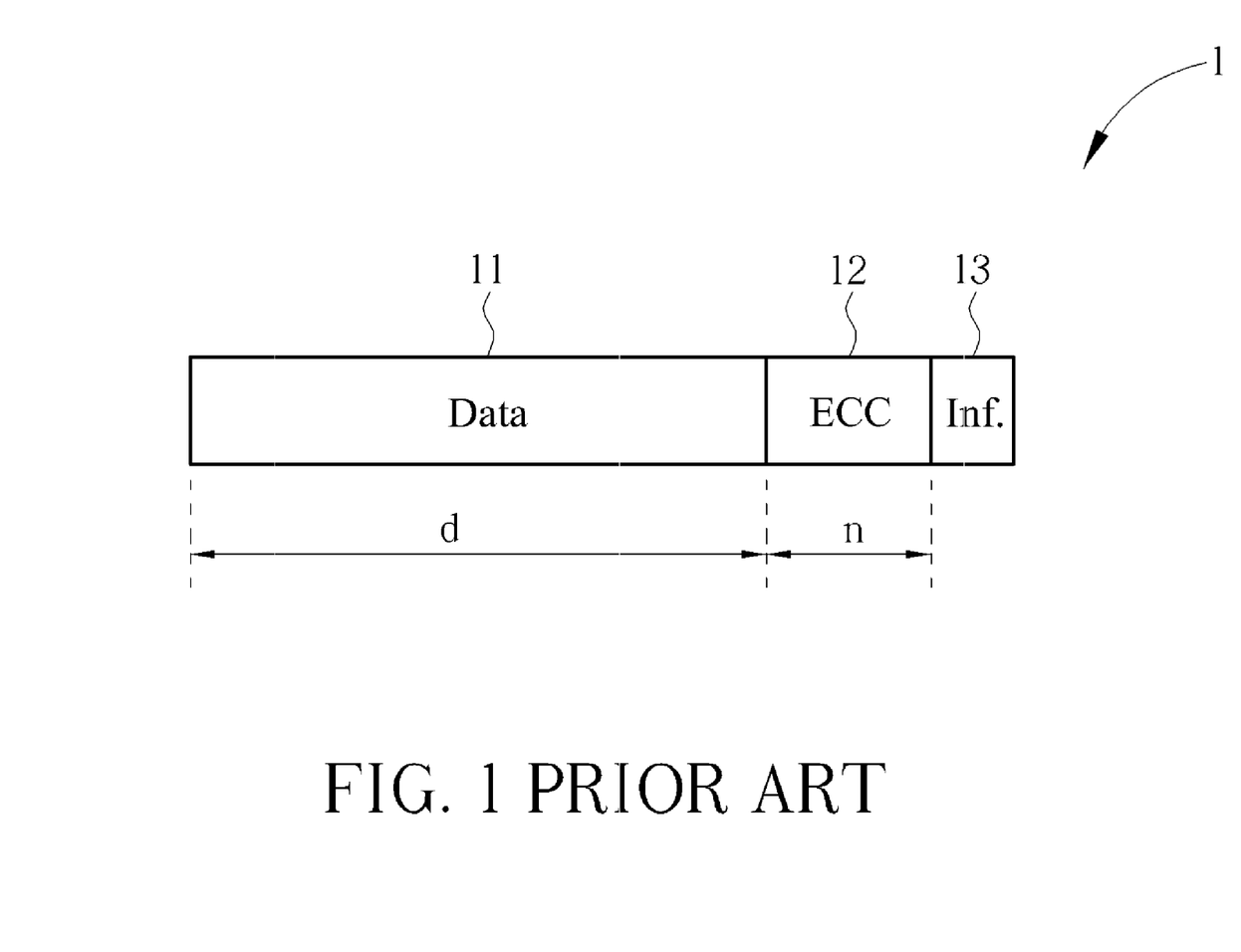
FIG. 1 is a schematic diagram of the recording format of a page of a NAND flash memory.
Figure 2:
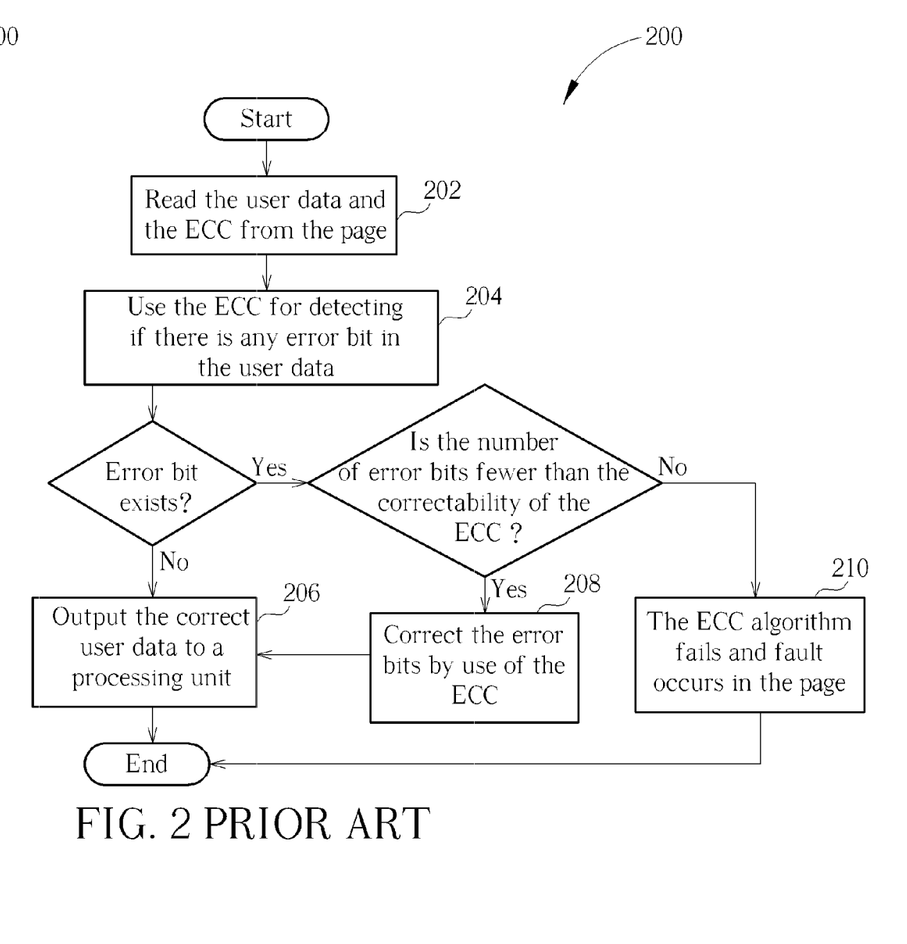
FIG. 2 is a schematic diagram of a flow chart illustrating the encoding and decoding procedures of ECC.

Please refer to FIG. 1 and FIG. 2. FIG. 1 is a schematic diagram of the recording format of a page 1 of a NAND flash memory and FIG. 2 is a schematic diagram of a flow chart illustrating the encoding and decoding procedures of ECC. A NAND flash memory is regulated to have minimum writing unit as a page when programming, where the page 1 includes d bytes user data 11, n bytes ECC 12, and an information area 13. The information area 13 is used to store the logical block address (LBA) of the memory, the erase times, and some firmware information. The ECC 12 is generated according to the user data 11 and the Bose-Chaudhuri-Hocquenghem (BCH) algorithm is the most common ECC encoding/decoding algorithm applied to NAND flash memory. Once the ECC 12 is generated, it can be used to correct up to T error bits for the user data 11 and the ECC 12 itself in page 1 (totally d+n bytes), where T is relevant to the length n of the ECC 12.

Please refer to FIG. 2. As previously mentioned, during the encoding process 100, the n bytes ECC 12 is first generated according to the user data 11 in Step 102 and then in Step 104, the user data and the ECC 12 are written to the page 1 of the memory. To ensure the correctness of the data in page 1 before they can be outputted and used, the ECC 12 is used to detect and correct the user data 11 as shown in the decoding process 200. The user data 11 and the ECC 12 are read from the page 1 in Step 202 and then in Step 204, the ECC 12 is used for detecting if there is any error bit in the user data 11. If no error bit exists, the correct user data 11 is outputted to a processing unit in Step 206. If there are error bits detected in Step 204, it should further be checked if the number of the error bits is fewer than the error correctability (T bits) of the ECC 12. If the number of the detected error bits is fewer than T bits, Step 208 is then performed as the ECC 12 is used to correct all the error bits of the user data 11. If the number of the detected error bits is more than T bits, then the ECC algorithm fails and fault occurs in the page 1 (Step 210).

Although the ECC is commonly used to deal with the error bits of the page 1, the error correctability of the ECC may no longer effective when the number of error bits of the page 1 will be easily exceeding T bits as the memory keeps being read/written, accompanying any aforementioned situations. The fault rate of the memory is inevitably increasing to harm its credibility. On the other hand, although the error correctability (T bits) may be enhanced by increasing the length of the ECC 12, it means more space should be used for the ECC 12, which decreases overall memory capacity.

SUMMARY OF THE INVENTION

The invention provides an error correction method for a memory device, which includes a first block having a first page and a second block having a second page. The method includes following steps: generating a first correction code and a second correction code according to a first data and a second data, wherein the first correction code and the first data are written to the first page, and the second correction code and the second data are written to the second page; wherein the first correction code includes a first inner correction code and a first cross correction code, and the second correction code includes a second inner correction code and a second cross correction code; using the first inner correction code for detecting and correcting errors of the first page and using the second inner correction code for detecting and correcting errors of the second page when reading the data of the first page and the second page; using the first cross correction code for detecting and correcting errors of odd bytes in both the first page and the second page; and using the second cross correction code for detecting and correcting errors of even bytes in both the first page and the second page.

The invention further provides an error correction method for a memory device, which includes a first page and a second page. The method includes following steps: generating a first correction code and a second correction code according to a first data and a second data, wherein the first correction code and the first data are written to the first page, and the second correction code and the second data are written to the second page; wherein the first correction code includes a first inner correction code and a first cross correction code, and the second correction code includes a second inner correction code and a second cross correction code; using the first inner correction code for detecting and correcting errors of the first page when reading the data of the first page; and using the first cross correction code for detecting and correcting errors of odd bytes in the first page and using the second cross correction code for detecting and correcting errors of even bytes in the first page.

The invention further provides a method for generating error correction code of a memory device, which includes a first block having a first page and a second block having a second page. The method includes following steps: generating a first inner correction code according to a first data and generating a second inner correction code according to a second data; generating a first cross correction code according to odd bytes of the first data and the second data and generating a second cross correction code according to even bytes of the first data and the second data; and writing the first data, the first inner correction code, and the first cross correction code to the first page and writing the second data, the second inner correction code, and the second cross correction code to the second page. The first inner correction code, the second inner correction code, the first cross correction code, and the second cross correction code have the same code length.

The invention further provides a memory device having error correction ability. The memory device includes a first block and a second block. The first block includes a first page, which includes a first data and a first correction code, wherein the first correction code includes a first inner correction code and a first cross correction code. The second block includes a second page, which includes a second data and a second correction code, wherein the second correction code includes a second inner correction code and a second cross correction code. The first block and other even numbered blocks of the memory device are of a first plane, the second block and other odd numbered blocks of the memory device are of a second plane. The first inner correction code includes error correction bytes of the first data, the second inner correction code includes error correction bytes of the second data, the first cross correction code includes error correction bytes of odd bytes of the first data and the second data, and the second cross correction code includes error correction bytes of even bytes of the first data and the second data.

These and other objectives of the present invention will no doubt become obvious to those of ordinary skill in the art after reading the following detailed description of the preferred embodiment that is illustrated in the various figures and drawings.

DETAILED DESCRIPTION

The error correction method and the related memory utilize the concurrent read/write feature of two distinct blocks in different planes of the NAND flash memory to mix and leverage encoding/decoding of the error correction code of two distinct pages, thereby enhancing error correctability of the ECC for one page without lengthening the ECC.

Figure 3:
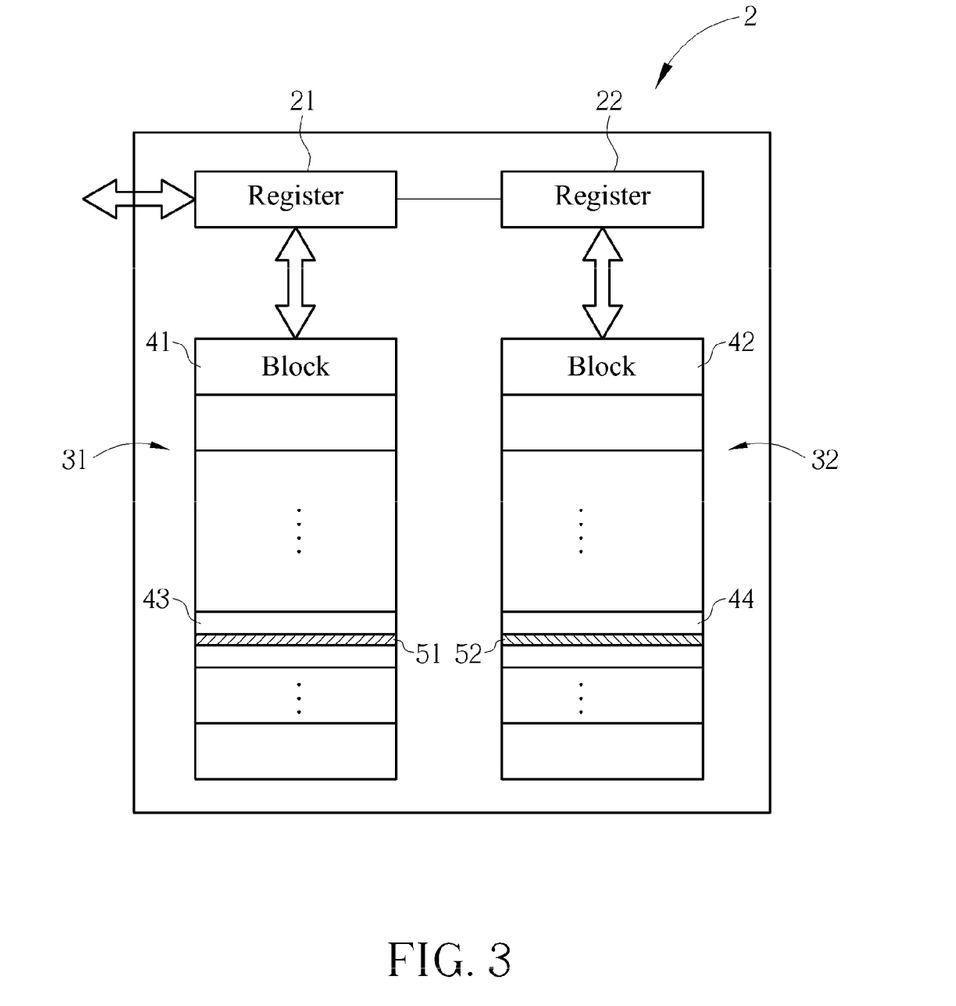
FIG. 3 is a schematic diagram showing a two-plane structure of a memory device according to the invention.

Please refer to FIG. 3. FIG. 3 is a schematic diagram showing a two-plane structure of a memory device 2 according to the invention. The memory device 2 includes at least a first plane 31 and a second plane 32. The first plane 31 may be defined to include all the even numbered blocks 41 (block 0, block 2, . . . , block 2N, where N is a non-negative integer) of one or more memory units of the memory device 2, and the second plane 32 may be defined to include all the odd numbered blocks 42 (block 1, block 2, . . . , block 2N+1, where N is a non-negative integer) of one or more memory units of the memory device 2. The first plane 31 and the second plane 32 can be two planes separately grouped from a same memory unit of the memory device 2 or from two distinct memory units. The even numbered blocks 41 in the first plane 31 and the odd numbered blocks 42 in the second plane 32 are composed by a plurality of pages respectively. The first plane 31 and the second plane 32 use a first register 21 and a second register 22 respectively for temporarily storing the page data to be read from or written into the blocks. In the following paragraphs, a first page 51 of a first block 43 in the first plane 31 and a second page 52 of a second block 44 in the second plane 32 are taken as descriptive examples.

Figure 4:
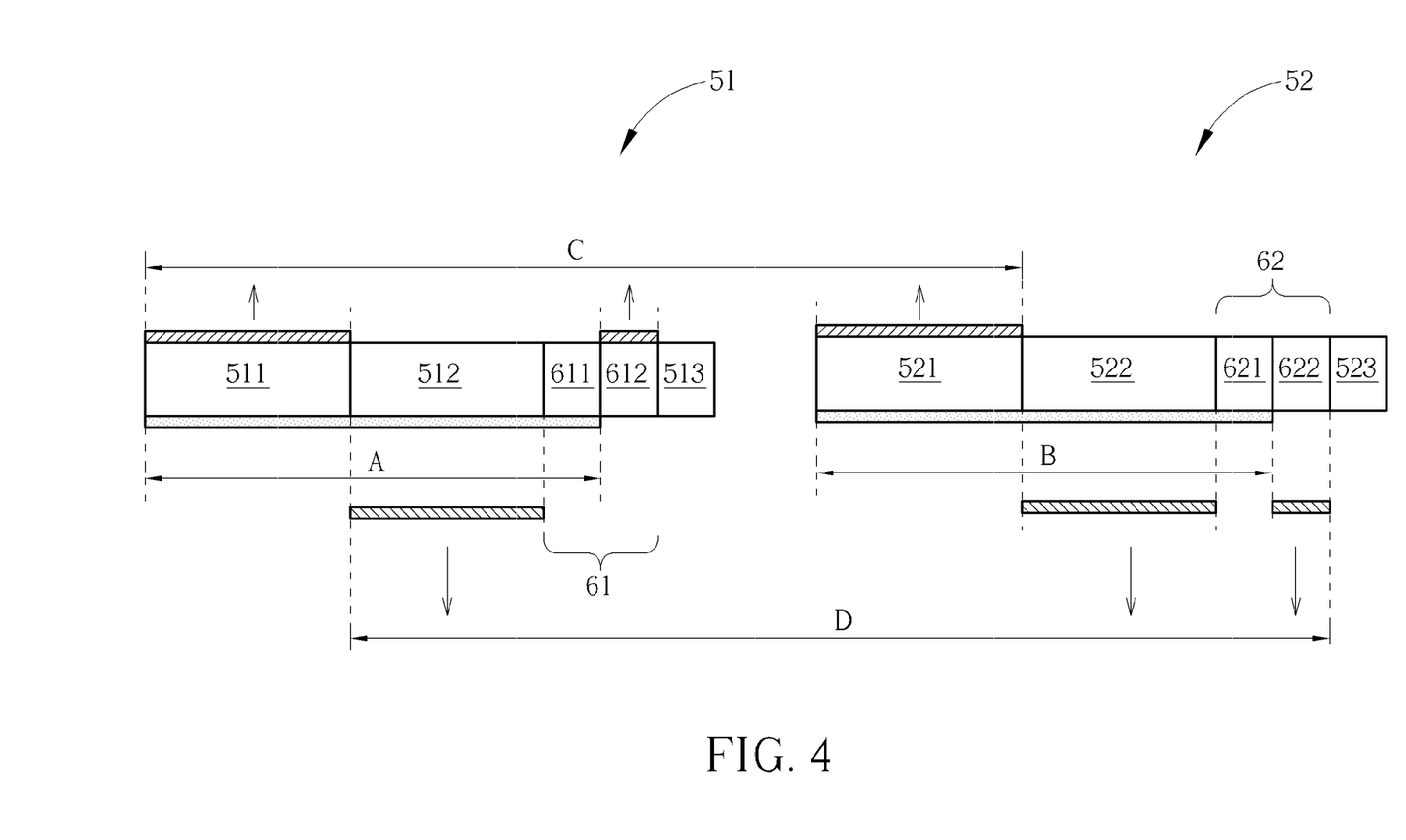
FIG. 4 is a schematic diagram of a first page and a second page belonging to two different blocks in two planes of the memory device.

Please refer to FIG. 4. FIG. 4 is a schematic diagram of the first page 51 and the second page 52, which belong to two different blocks in two planes of the memory device 2. The invention utilizes the ECC of another page (the second page 52, for example) in another block to enhance the error correctability of a specific page (the first page 51, for example). Please also refer to FIG. 1 for the prior art page format as a comparison. A first data (user data) of the first page 51 is composed of odd numbered bytes 511 and even numbered bytes 512 and a second data (user data) of the second page 52 is composed of odd numbered bytes 521 and even numbered bytes 522, where both the first data and the second data have d bytes respectively. As for the error correction code, both a first correction code 61 of the first page 51 and a second correction code 62 of the second page 52 have n bytes respectively, which is the same length as those in conventional format illustrated in FIG. 1. The first correction code 61 includes a first inner correction code 611 and a first cross correction code 612, and the second correction code 62 includes a second inner correction code 621 and a second cross correction code 622, where the first inner correction code 611, the first cross correction code 612, the second inner correction code 621, and the second cross correction code 622 have the same length, i.e., n/2 bytes, where the term 'cross' represents that each cross correction code 612 (622) has to do with both user data and is not in an internal level.

Figure 5:
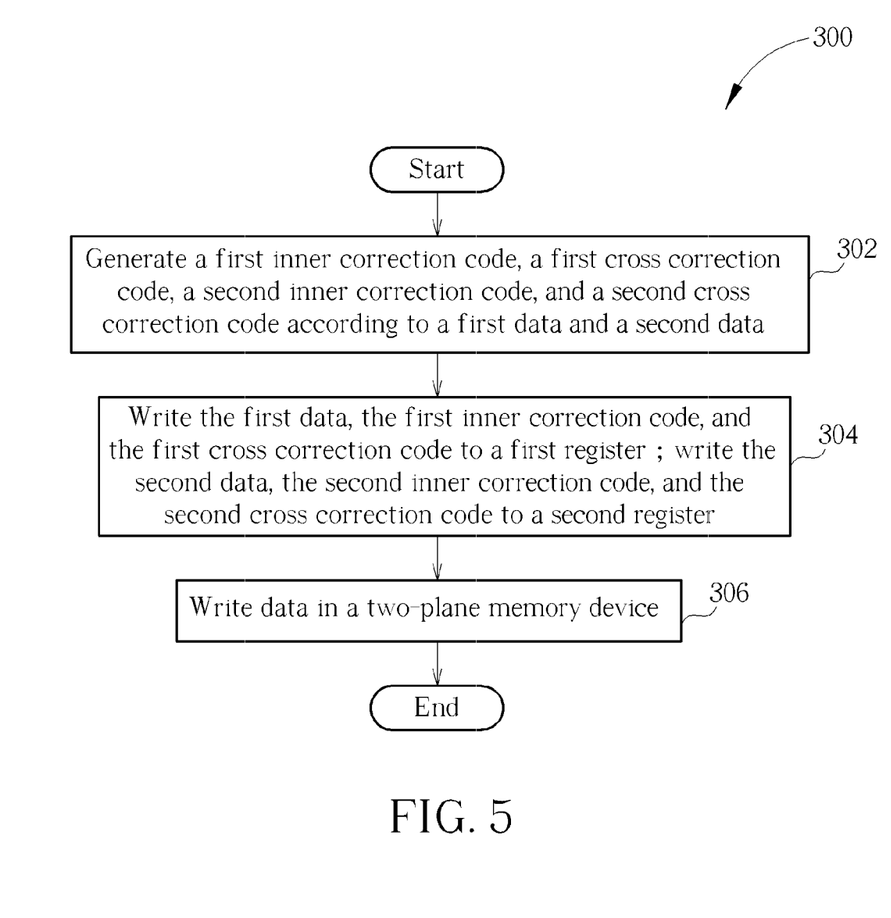
FIG. 5 is a flow chart showing a method for generating the ECC of a memory according to the invention.

Please also refer to FIG. 5. FIG. 5 is a flow chart showing a method 300 for generating the ECC of a memory according to the invention. The method 300 includes the following steps:

In Step 302, the error correction code (ECC) algorithm is used to generate the first inner correction code 611 according to the first data, including the odd numbered bytes 511 and the even numbered bytes 512. Hence, the first inner correction code 611 includes error correction bytes of the first data; since its length is n/2 bytes, the error correctability of the first inner correction code 611, compared to the example in FIG. 1, is T/2 bits and is shown as region A in FIG. 4. Likewise, the error correction code (ECC) algorithm is used to generate the second inner correction code 621 according to the second data, including the odd numbered bytes 521 and the even numbered bytes 522. Hence, the second inner correction code 621 includes error correction bytes of the second data; since its length is n/2 bytes, the error correctability of the second inner correction code 621, compared to the example in FIG. 1, is also T/2 bits and is shown as region B in FIG. 4.

The first cross correction code 612 of the first page 51 is generated according to the odd numbered bytes 511 of the first data and the odd numbered bytes 521 of the second data. Hence, the first cross correction code 612 includes error correction bytes of the odd numbered bytes 511 and the odd numbered bytes 521; since the odd numbered bytes 511 and the odd numbered bytes 521 are half the length of the first data and the second data respectively and the length of the first cross correction code 612 is n/2 bytes, the error correctability of the first cross correction code 612, compared to the example in FIG. 1, is also T/2 bits and is shown as region C in FIG. 4. The second cross correction code 622 of the second page 52 is also generated in a similar way as the first cross correction code 612, according to the even numbered bytes 512 and the even numbered bytes 522, with error correctability T/2 bits and is shown as region D in FIG. 4. An information area 513 and an information area 523 of the first page 51 and the second page 52 are similar as the prior art and are omitted in description for brevity.

Next in Step 304, the first data (including the odd numbered bytes 511 and the even numbered bytes 512), the first correction code 61 (including the first inner correction code 611 and the first cross correction code 612), and the information area 513 are written to the first register 21, and the second data (including the odd numbered bytes 521 and the even numbered bytes 522), the second correction code 62 (including the second inner correction code 621 and the second cross correction code 622), and the information area 523 are written to the second register 22. In Step 306, two-plane memory writing is performed so that the data of the first register 21 and the data of the second register 22 can be written to the first page 51 and the second page 52 respectively and concurrently to finish the encoding procedure of the invention.

Figure 6:
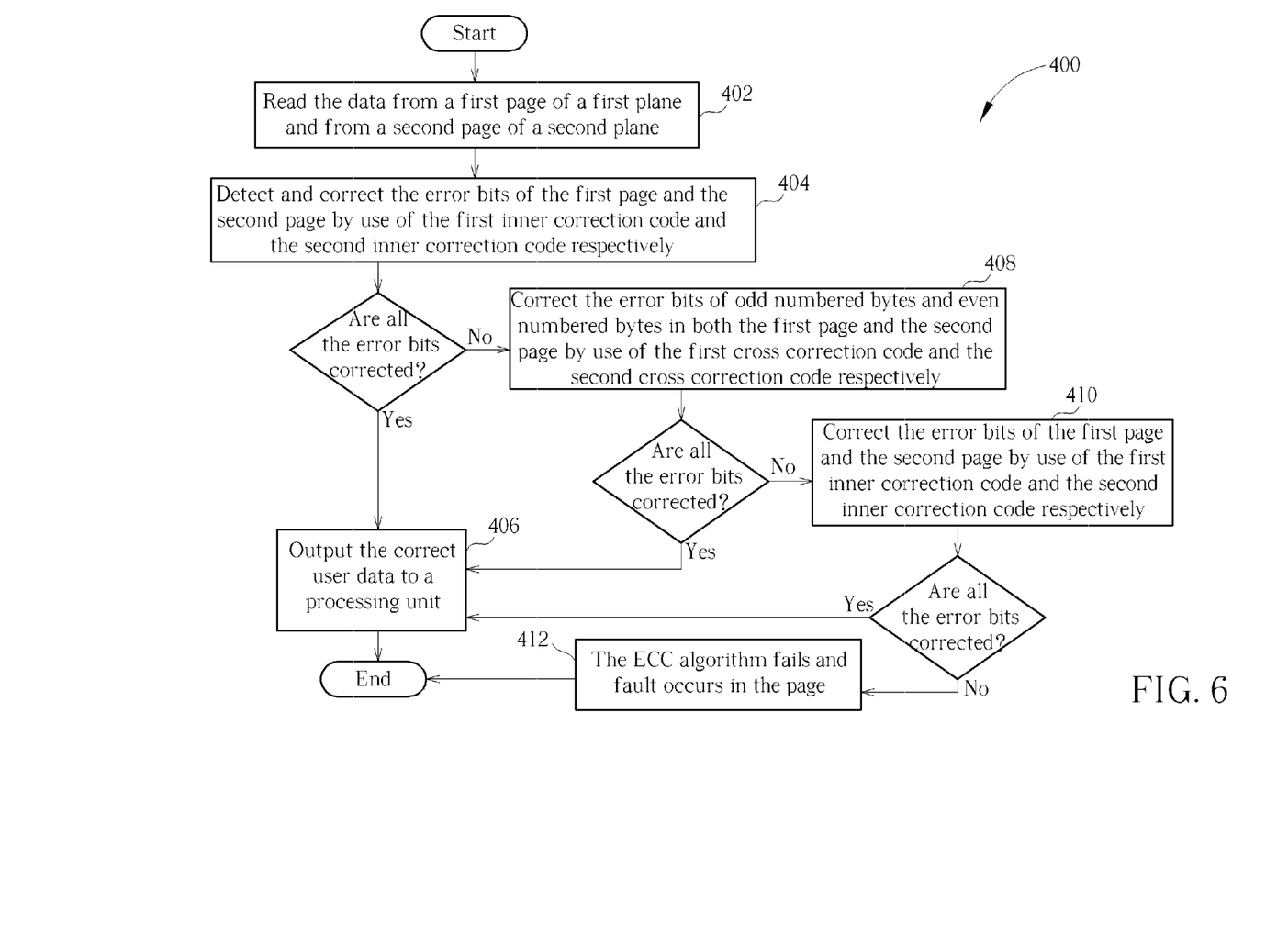
FIG. 6 is a flow chart showing a method for correcting errors of a memory device by use of two-plane ECC according to the invention.

Please refer to FIG. 6. FIG. 6 is a flow chart showing a method 400 for correcting errors of a memory device by use of two-plane ECC according to the invention. The method 400 includes the following steps:

Step 402: read the data from the first page 51 of the first plane 31 to the first register 21 and from the second page 52 of the second plane 32 to the second register 22.

Step 404: the first inner correction code 611 and the second inner correction code 621 are respectively used to detect and correct the error bits of the first page 51 and the second page 52. In this step, the pages 51, 52 use their own inner correction codes 611, 621 as a first move to fix the error bits. Although the error correctability of either the first inner correction code 611 or the second inner correction code 621 is T/2 bits, for most situations when the error bits of a page is relatively minor, Step 404 can deal with most error cases speedily. Plus, the n/2 bytes length of each inner correction code makes it faster in error detection and correction.

Step 406: if all the error bits are fixed/corrected, the correct user data is outputted to a related processing unit.

Step 408: if the correction procedure in Step 404 can not fix all the errors of the page, which in other words, the number of error bits of the page is larger than the error correctability, T/2 bits, of the inner correction code, then use the first cross correction code 612 and the second cross correction code 622 to respectively correct the error bits of odd numbered bytes 511, 521 in the first page 51 and the second page 52, and the error bits of even numbered bytes 521, 522 in the first page 51 and the second page 52.

It is noted that for the user data of the first page 51 to be read, and the first page 51 is detected and corrected for its error bits by use of the method disclosed in the invention, the method of the invention utilizes a second page 52 to enhance the error correctability of the first page 51. The theory is that in a memory device, it is very unlikely to have pages in two different planes/blocks reporting same scale of bit error. On the other hand, the worn-out rate of different planes/blocks also differs. As the number of error bits of the first page 51 is too many for the first inner correction code 611 to correct (Step 404), the second page 52 of a block on another plane that has fewer error bits is to help correcting. Hence, in Step 408, the two cross correction codes 612, 622 of the two pages are utilized for correcting the error bits in different groups of bytes. If the error bits are correctable, then Step 406 is performed. While the method in this embodiment focuses on considering whether the error bits of the first page 51 are correctable, it may also deal with the second page 52 and correct the error bits of the second page 52.

Step 410: if some error bits are still remaining uncorrected in the first page 51 after Step 408, the first inner correction code 611 and the second inner correction code 621 are again utilized to correct the remaining error bits in the first page 51 and the second page 52, where the second inner correction code 621 is used if the second page 52 is also needed to correct its error bits. Step 406 is then performed after all the error bits of the first page 51 are corrected.

Step 412: if there are still error bits remaining uncorrected after Step 410, it can be concluded that the error bits of the first page 51 outnumbers the error correctability by use of the ECC algorithm. The ECC algorithm fails and fault occurs in the first page 51.

Figure 7:
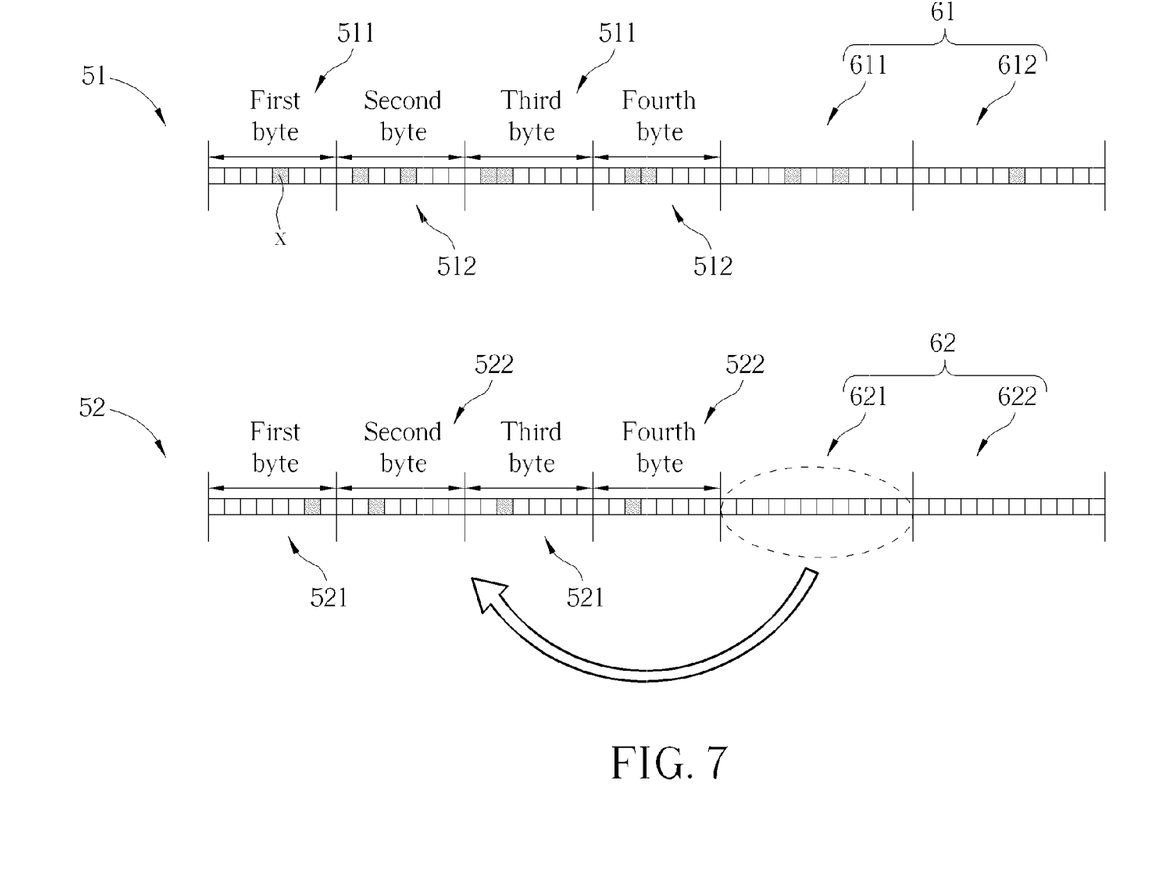
FIG. 7 to FIG. 10 are schematic diagrams that show an embodiment of using the method of the invention to correct the error bits or two corresponding pages belonging to two different blocks in two planes.

Please refer to FIG. 7 to FIG. 10. FIG. 7 to FIG. 10 are schematic diagrams that show an embodiment of using the method of the invention to correct the error bits or two corresponding pages belonging to two different blocks in two planes, and the data in the first page 51 is to be outputted. According to the previous description, both the first page 51 and the second page 52 have d bytes user data and n bytes correction codes 61, 62 respectively. It can be exemplarily assumed that an n byte correction code 61 for the first page 51 has error correctability T=8 bits. In other words, each of the first inner correction code 611 and the first cross correction code 612 of the first correction code 61, and the second inner correction code 621 and the second cross correction code 622 of the second correction code 62 has error correctability T/2=4 bits. In Step 404, the first page 51 in FIG. 7 is detected to have 10 error bits x, including the error bits in the first correction code 61, and is beyond the correctability of the first inner correction code 611 (and also beyond the correctability of the prior art), and since the second page 52 is detected to have 4 error bits x, the second inner correction code 621 can be used to correct the 4 error bits x of the second page 52 as performed in Step 404.

Figure 8:
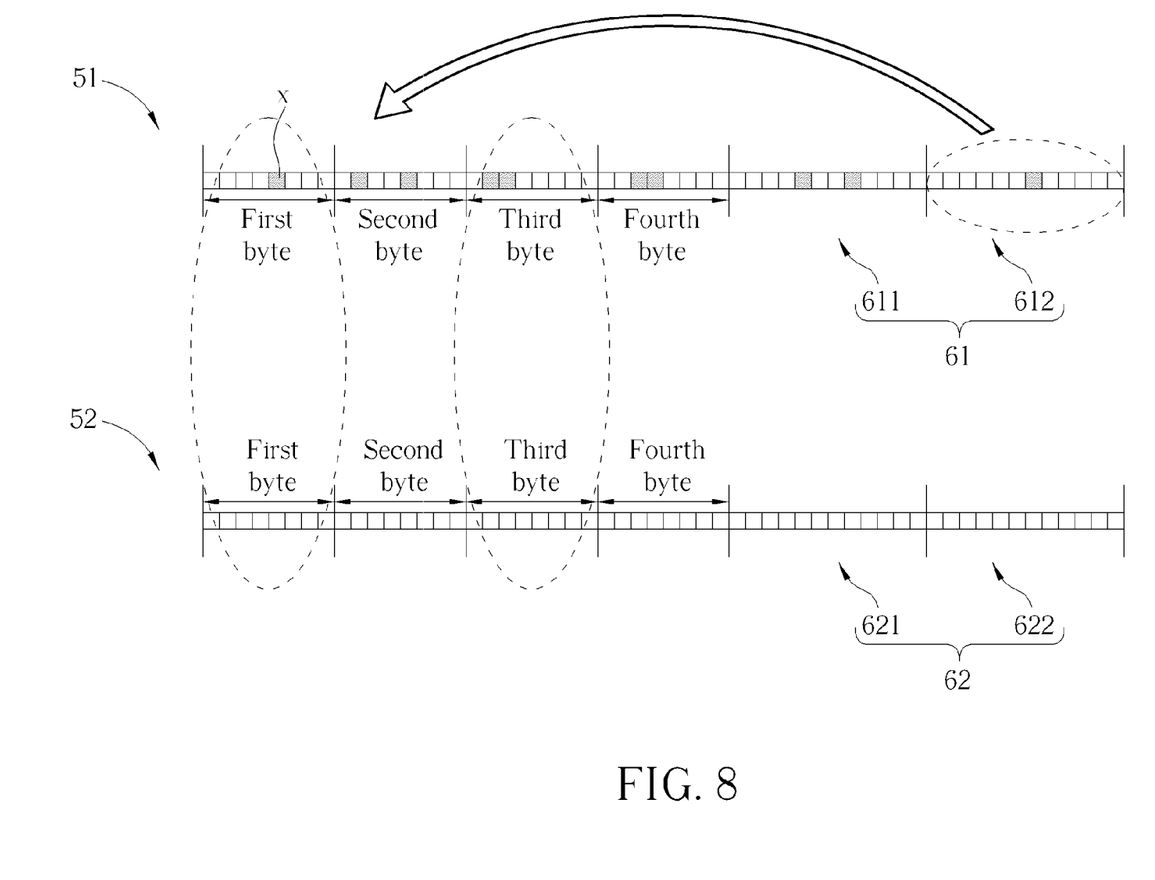
Figure 9:
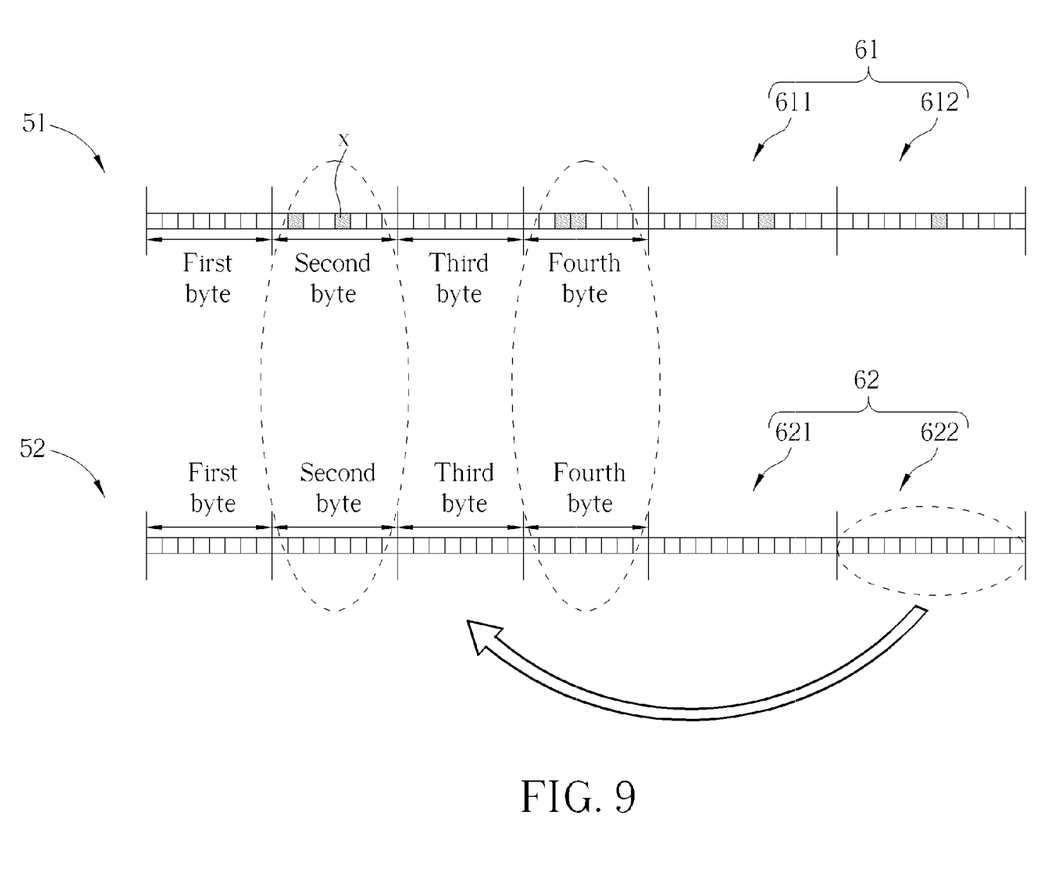
Figure 10:
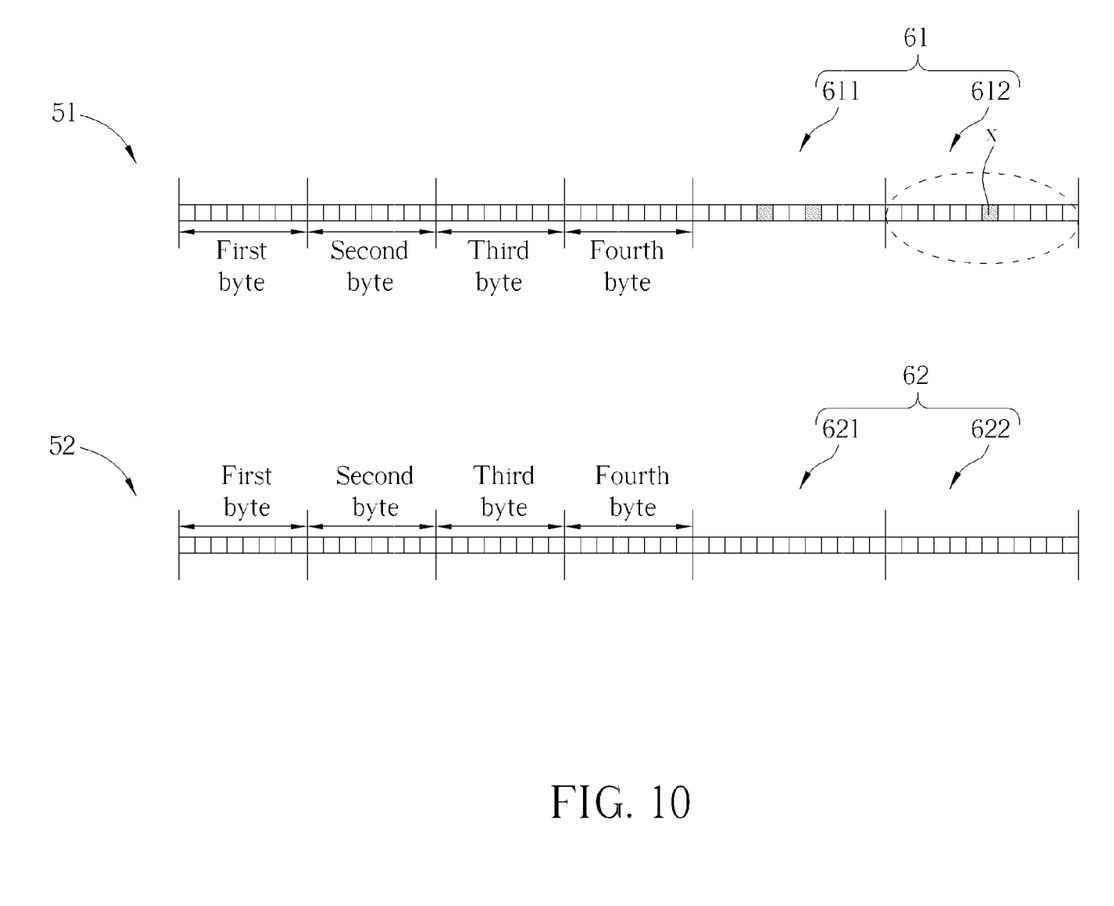

Next in FIG. 8, Step 408 is performed. At this stage, there are totally 4 error bits x found in the odd numbered bytes 511, 521 of the first page 51 and the second page 52 and the first cross correction code 612, which falls under the correctability of the first cross correction code 612. The first cross correction code 612 of the first page 51 is then utilized to correct these error bits in the odd numbered bytes 511, 521. FIG. 9 follows and shows that the second cross correction code 622 of the second page 52 is utilized to correct the error bits in the even numbered bytes 521, 522 (the 4 error bits found therein fall under the correctability of the second cross correction code 622). Finally in FIG. 10, all the error bits x in the first page 51 and the second page 52 are corrected.

In other embodiments of the invention, if there are still some error bits remaining uncorrected after performing steps in FIG. 9, Step 410 is ready to further use the inner correction codes to correct the rest of the error bits, which at this stage, it is highly probable that the error bits have been reduced extensively so that there is even greater opportunity compared with that in Step 404 to totally correct the rest of the error bits.

In these embodiments, the error correctability of one single page can be enhanced up to 3T/2 bits by mixing and leveraging the ECC of two pages, without physically increasing the length of the ECC of each page. The 3T/2 bits error correctability can be easily known by referring to FIG. 4 that since the first page 51 can be corrected by use of the first inner correction code 611, the first cross correction code 612, and the second cross correction code 622, there are totally 3×(T/2) bits error correctability for the first page 51. The method and the memory device that uses the method of the invention utilize the feature that the probability of concurrent abnormity of two different blocks is far less than that of one single block, and that the program disturb is rarely happening between two different blocks, so that a page with fewer error bits (the second page 52 as mentioned) may be used to fix the data of a page (the first page 51 as mentioned) having abnormity.

It should be noted that of all the length of the user data, including the first data and the second data, of the error correction codes 61, 62 in the page illustrated in FIG. 4, FIG. 7~10 and in the paragraphs, they are used as exemplary and comparison purposes. The error correction method disclosed in the invention can extensively apply to memory device and method with any available data length and ECC length. Additionally, grouping the user data and error correction code into the odd numbered one and the even numbered one is also for exemplary purpose. Any ways of grouping are available to implement the invention. Any process that uses the data and ECC from a second page to enhance the error correctability of a first page without increasing the physical ECC length of the first page should be within the scope of the invention.

Those skilled in the art will readily observe that numerous modifications and alterations of the device and method may be made while retaining the teachings of the invention.

What is claimed is:

1. An error correction method for a memory device, which comprises a first block having a first page and a second block having a second page, the method comprising steps:
   generating a first correction code and a second correction code according to a first data and a second data, wherein the first correction code and the first data are written to the first page, and the second correction code and the second data are written to the second page; wherein the first correction code comprises a first inner correction code and a first cross correction code, and the second correction code comprises a second inner correction code and a second cross correction code;
   using the first inner correction code for detecting and correcting errors of the first page when reading the data of the first page and using the second inner correction code for detecting and correcting errors of the second page when reading the data the second page;
   using the first cross correction code for detecting and correcting errors of odd bytes in both the first page and the second page; and
   using the second cross correction code for detecting and correcting errors of even bytes in both the first page and the second page.

2. The method of claim 1, wherein generating a first correction code and a second correction code according to a first data and a second data comprising steps:
   generating the first inner correction code according to the first data and generating the second inner correction code according to the second data by use of error correction code (ECC) algorithm;
   generating the first cross correction code according to the odd bytes of the first data and the second data by use of ECC algorithm; and
   generating the second cross correction code according to the even bytes of the first data and the second data by use of ECC algorithm;
   wherein the first inner correction code, the second inner correction code, the first cross correction code, and the second cross correction code have the same code length.

3. An error correction method for a memory device, which comprises a first page and a second page, the method comprising steps:
   generating a first correction code and a second correction code according to a first data and a second data, wherein the first correction code and the first data are written to the first page, and the second correction code and the second data are written to the second page;
   wherein the first correction code comprises a first inner correction code and a first cross correction code, and the second correction code comprises a second inner correction code and a second cross correction code;
   using the first inner correction code for detecting and correcting errors of the first page when reading the data of the first page; and
   using the first cross correction code for detecting and correcting errors of odd bytes in the first page and the second page and using the second cross correction code for detecting and correcting errors of even bytes in the first page and the second page.

4. A method for generating error correction code of a memory device, which comprises a first block having a first page and a second block having a second page, the method comprising steps:
   generating a first inner correction code according to a first data and generating a second inner correction code according to a second data;
   generating a first cross correction code according to odd bytes of the first data and the second data and generating a second cross correction code according to even bytes of the first data and the second data; and
   writing the first data, the first inner correction code, and the first cross correction code to the first page and writing the second data, the second inner correction code, and the second cross correction code to the second page;
   wherein the first inner correction code, the second inner correction code, the first cross correction code, and the second cross correction code have the same code length.

5. The method of claim 4, wherein the first inner correction code, the second inner correction code, the first cross correction code, and the second cross correction code are respectively generated by use of error correction code (ECC) algorithm.

6. A memory device having error correction ability, comprising:
   a first block comprising a first page, which comprises a first data and a first correction code, wherein the first correction code comprises a first inner correction code and a first cross correction code; and
   a second block comprising a second page, which comprises a second data and a second correction code, wherein the second correction code comprises a second inner correction code and a second cross correction code;
   wherein the first block and other even numbered blocks of the memory device are of a first plane, the second block and other odd numbered blocks of the memory device are of a second plane; wherein the first inner correction code comprises error correction bytes of the first data, the second inner correction code comprises error correction bytes of the second data, the first cross correction code comprises error correction bytes of odd bytes of the first data and the second data, and the second cross correction code comprises error correction bytes of even bytes of the first data and the second data.

7. The memory device of claim 6, wherein the first block and the second block are two distinct blocks of a same memory unit of the memory device.

8. The memory device of claim 6, wherein the first block and the second block are blocks of two distinct memory units respectively of the memory device.

9. The memory device of claim 6, wherein each of the first correction code and the second correction code has code length of n bytes, and each of the first inner correction code, the first cross correction code, the second inner correction code, and the second cross correction code has code length of n/2 bytes, where n is positive integer.

10. The memory device of claim 6, wherein the first plane further comprises a first register and the second plane further comprises a second register for storing the first data and the second data temporarily.

* * * * *